(12) United States Patent
Pai

(10) Patent No.: US 7,503,767 B2
(45) Date of Patent: Mar. 17, 2009

(54) METHOD AND APPARATUS FOR COMPLIANTLY CONNECTING STACK OF HIGH-DENSITY ELECTRONIC MODULES IN HARSH ENVIRONMENTS

(75) Inventor: Deepak Pai, Burnsville, MN (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 0 days.

(21) Appl. No.: 11/496,467

(22) Filed: Aug. 1, 2006

(65) Prior Publication Data

US 2008/0032517 A1    Feb. 7, 2008

(51) Int. Cl.
*H01R 12/00* (2006.01)
(52) U.S. Cl. ....................................... 439/66
(58) Field of Classification Search ................... 439/65, 439/66, 67, 69, 91, 591, 81, 492, 541.5; 361/737
See application file for complete search history.

(56) References Cited

U.S. PATENT DOCUMENTS

| | | | | |
|---|---|---|---|---|
| 4,161,655 | A | * | 7/1979 | Cotic et al. .............. 250/385.1 |
| 4,894,015 | A | * | 1/1990 | Stockero et al. ............... 439/67 |
| 4,939,624 | A | * | 7/1990 | August et al. ............... 361/816 |
| 5,201,855 | A | | 4/1993 | Ikola |
| 5,450,286 | A | * | 9/1995 | Jacques et al. .............. 361/749 |
| 5,502,667 | A | | 3/1996 | Bertin et al. |
| 5,548,484 | A | * | 8/1996 | Kantner ...................... 361/737 |
| 5,548,486 | A | | 8/1996 | Kman et al. |
| 5,605,477 | A | * | 2/1997 | Wu et al. ................ 439/620.24 |
| 5,884,319 | A | | 3/1999 | Hafner et al. |
| 6,104,614 | A | | 8/2000 | Chou et al. |
| 6,109,929 | A | | 8/2000 | Jasper |
| 6,128,201 | A | | 10/2000 | Brown et al. |
| 6,206,705 | B1 | | 3/2001 | Bolotin et al. |
| 6,682,955 | B2 | | 1/2004 | Cobbley et al. |
| 6,703,651 | B2 | | 3/2004 | Worz et al. |
| 6,711,030 | B2 | | 3/2004 | Akiba |
| 6,859,370 | B1 | | 2/2005 | Hsu et al. |
| 6,892,646 | B1 | | 5/2005 | Zimmerman et al. |
| 7,172,199 | B2 | | 2/2007 | Hall |
| 7,232,315 | B2 | * | 6/2007 | Uchida et al. .................. 439/67 |
| 7,247,035 | B2 | * | 7/2007 | Mok et al. ..................... 439/81 |
| 2003/0092314 | A1 | | 5/2003 | Whiteside et al. |
| 2005/0032398 | A1 | * | 2/2005 | Perret et al. .................... 439/67 |
| 2006/0105640 | A1 | * | 5/2006 | Vance ......................... 439/862 |

FOREIGN PATENT DOCUMENTS

JP    10-173124    6/1998

* cited by examiner

*Primary Examiner*—Chandrika Prasad
(74) *Attorney, Agent, or Firm*—Steptoe & Johnson LLP

(57) ABSTRACT

A system for connecting circuit boards is provided. A plurality of overlapping spaced apart circuit boards have a plurality of conductive pins passing through holes in the circuit boards. A connector includes a flexible sheet insulator and a plurality of conductive surfaces separated and supported by the flexible insulator. At least one of the conductive surfaces has a hole there through and a bent compliant lead extending there from. The hole engages one of the pins, and the complaint lead connects to one of the circuit boards.

22 Claims, 5 Drawing Sheets

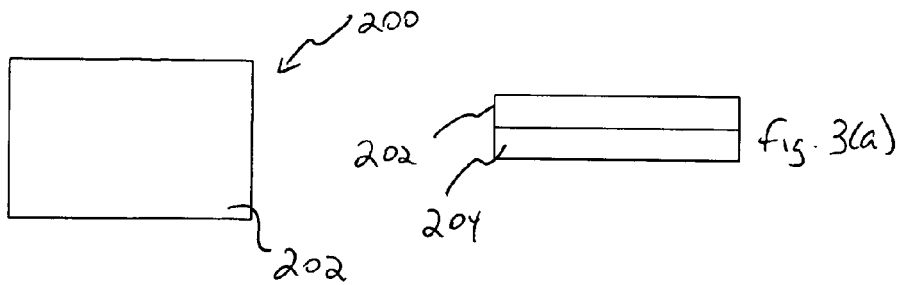
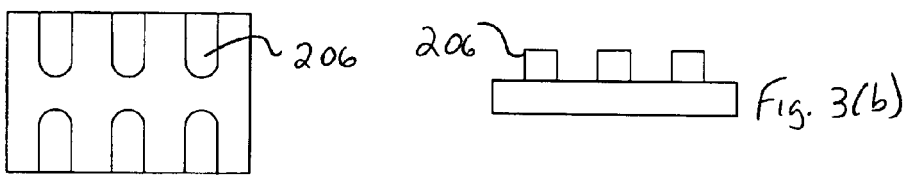
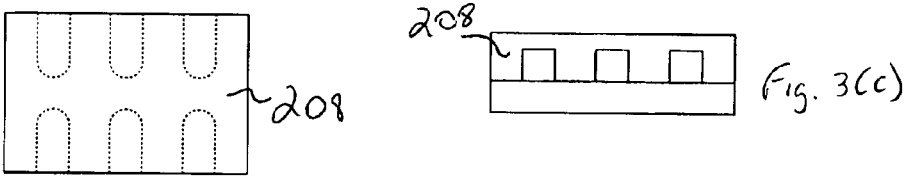
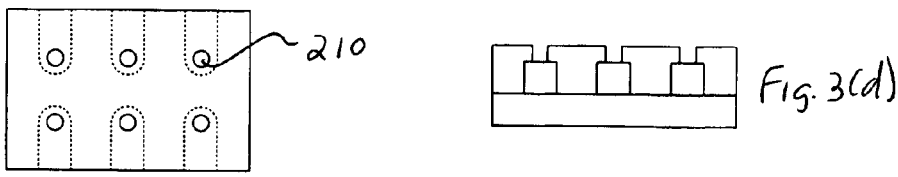
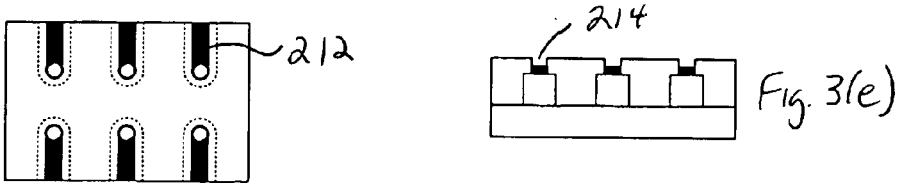

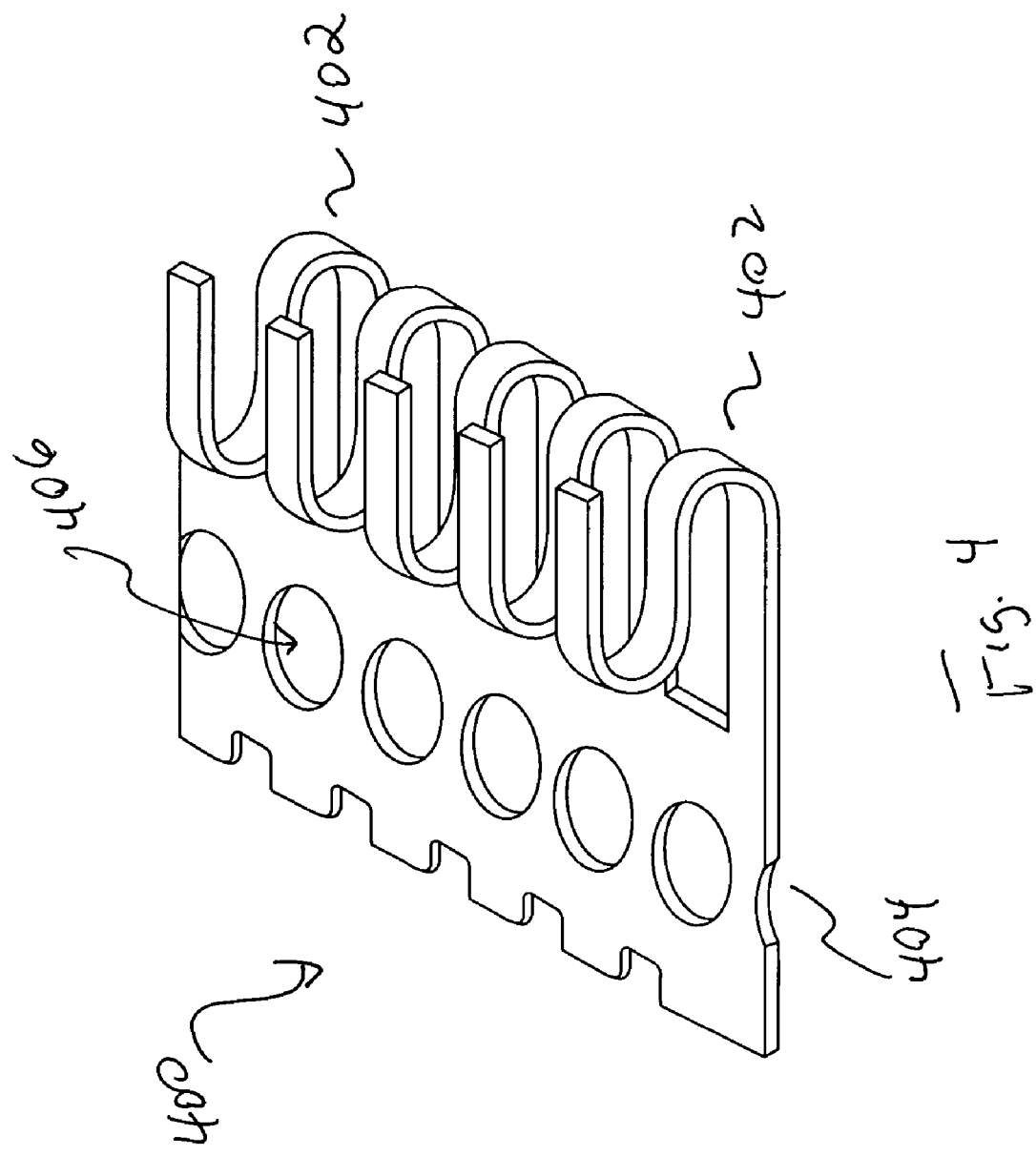

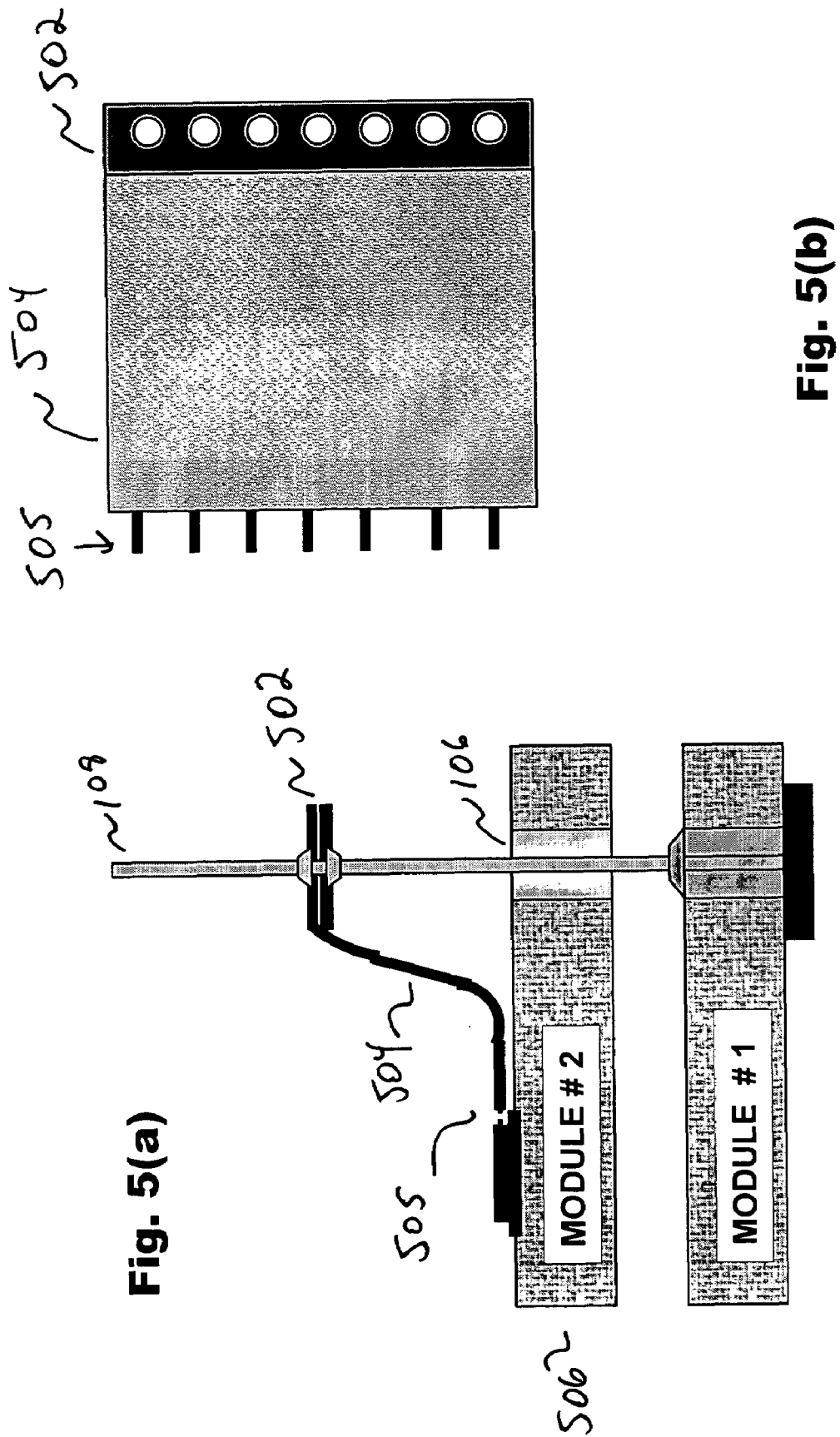

METHOD AND APPARATUS FOR COMPLIANTLY CONNECTING STACK OF HIGH-DENSITY ELECTRONIC MODULES IN HARSH ENVIRONMENTS

BACKGROUND OF THE INVENTION

1. Field of the Invention

The present invention relates to interconnections for multiple-stacked printed circuit boards. More specifically, the present invention relates to a connector with compliant leads for multiple-stacked printed circuit boards.

2. Discussion of Background Information

In the manufacture of printed circuit boards and similar electrical devices, it is desirable to make connections to the device and between devices. One technique for making this connection is to employ pins which are mechanically and sometimes electrically connected to the devices.

In the design of complicated electronic components, it is not uncommon to arrange circuit boards and other like devices in stacked relation with numerous electrical connections being made between the different boards. Typically this is done by providing a first circuit board with pins of either compliant or non-compliant types, moving a second circuit board into position such that the pins projecting from the first circuit board engage corresponding positions in the second circuit board, and then soldering the pins to the second circuit board to lock them in place.

The above prior art design is adequate for standard commercial uses, but is not suitable for certain environments. For example, military and space environments may subject the solder joints to extreme temperatures, pressures (or vacuum) and/or mechanical shock. The solder joints between the pins and the boards may begin to crack and break under the continued stress of such intense military and/or space applications, and therefore do not provide a reliable connection for all environments.

SUMMARY

According to a preferred embodiment of the invention, a system for connecting circuit boards is provided. A plurality of overlapping spaced apart circuit boards have a plurality of conductive pins passing through holes in the circuit boards. A connector includes a flexible sheet insulator and a plurality of conductive surfaces separated and supported by the flexible insulator. At least one of the conductive surfaces has a hole there through and a bent compliant lead extending there from. The hole engages one of the pins, and the complaint lead connects to one of the circuit boards.

The above embodiment may have various features. The compliant lead may have a substantially S shape, C shape, or Z shape. The flexible insulator may be a polyimide film. The compliant lead may be made of copper covered with solder. The hole may be bordered by copper covered with solder. Solder may connect the hole to the one of the pins, or the hole and the one of the pins may form a press fit.

According to another embodiment of the invention, a connector is provided. A plurality of conductive surfaces are separated and supported by a flexible insulator. Each of the conductive surfaces has a hole there through and a bent compliant lead extending there from.

The above embodiment may have various features. The compliant lead may have a substantially S shape, C shape, or Z shape. The flexible insulator may be a polyimide film. The compliant lead may be made of copper covered with solder. The hole may be bordered by copper covered with solder. Solder may connect the hole to the one of the pins, or the hole and the one of the pins may form a press fit.

According to yet another embodiment of the invention, a connector is provided. A plurality of conductive surfaces are separated and supported by a flexible insulator. Each of the conductive surfaces having a hole there through. A flex cable supports a plurality of conductive paths. Each path is connected to a different one of the plurality of conductive surfaces.

The above embodiment may have various features. The flexible insulator may be a polyimide film. The hole may be bordered by copper covered with solder.

According to still yet another embodiment of the invention, a method for manufacturing a connector is provided. A layer of conductive material and a layer of a flexible insulator are provided. Portions of the conductive material are removed to form distinct conductive regions supported by the flexible insulator. A hole is formed in each of the distinct regions. Portions of the distinct regions are plated. Bent compliant leads are attached to at least some of the distinct regions.

The above embodiment may have various optional features. The attaching may include providing an array of leads connected to a common support, applying solder paste or flux to the array of leads, aligning the leads with corresponding ones of the distinct regions, heating at least the array and the district regions, and removing the support. The method may further include providing a circuit board and at least one pin passing through the circuit board, threading the at least one pin through corresponding ones of the holes, and connecting at least some of the leads to the circuit board.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein:

FIGS. 2(a)-(e) are top views of the formation of a flex board according to an embodiment of the invention.

FIGS. 3(a)-(e) are side views of the flex board corresponding to FIGS. 2(a)-(e), respectively.

FIG. 4 is a perspective view of a lead array according to an embodiment of the invention.

FIG. 5 is a side view of a connector according to another embodiment of the invention.

DETAILED DESCRIPTION OF EXEMPLARY EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
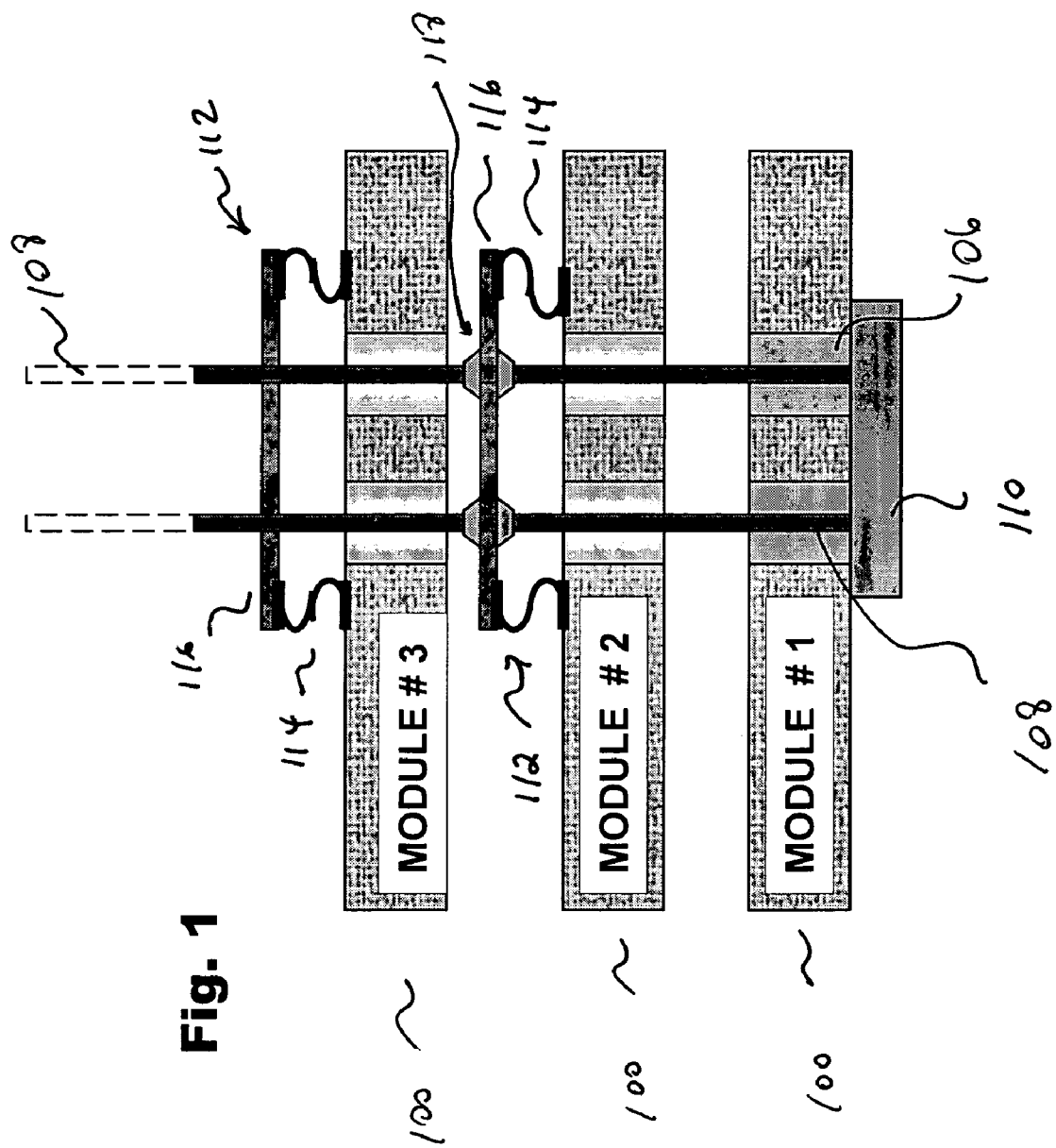
FIG. 1 is a side view of an assembly of several circuit boards using connectors according to an embodiment of the invention.

Referring now to FIG. 1, an illustrative side view of the implementation of an embodiment of the present invention is show. Three circuit boards 100, individual labeled as modules #1, #2, and #3, are vertically stacked, although any number may be so stacked. Each circuit board 100 has holes 106 through which pass pins 108. Although boards 100 and holes 106 are shown artistically in perfect alignment, in practice some variations and imperfections are expected within manufacturing tolerances. Holes 106 are preferably about 20 mils in diameter, and pins 108 are preferably about 8-10 mils in diameter.

Pins 108 are mounted at their base to a connector 110, which is preferably soldered to the underside of the bottom most circuit board 100 (module #1). Holes 106 for this bottommost board are preferably substantially filed with solder to hold pins 108. A non-limiting example of such solder (as discussed throughout the application) is made of 63% tin and 37% lead, although other solders could be used.

Pins 108 connect to electronics on boards 100 for other modules through connectors 112. Each connector 112 includes a flex board 116 and a plurality of complaint leads 114.

Referring now to FIGS. 2(a)-(e) and 3(a)-(e), the flex board 116 is manufactured as follows (dimensions exaggerated for illustrative purposes). A two-layer component 200 includes a conductor 202 on the top side and an insulator 204 on the bottom side, preferably cooper as the conductor and a polyimide film such as KAPTON as the insulator. Component 200 is preferably either manufactured to the specified size or cut to size from a larger lot.

Copper is etched from conductor 202 using standard techniques to provide a plurality of separate copper pads 206. The entire top surface is then covered with an insulator 208, preferably of the same type as insulator 204. Insulator material is then removed from insulator 204 and/or 208 (208 in the figures) to expose at least a portion of the underlying copper pad 206, which will later form the attachment point for the compliant leads. Holes 210 for pins 108 are then drilled through the interior ends of copper pads 206. The exposed underlying copper surfaces are then plated with solder 212 to form conductive pads 214.

Referring now to FIG. 4, an array 400 of compliant leads 402 is shown. Each lead 402 is preferably a copper core covered with a layer of solder. Array 400 is preferably either manufactured to the specified size or cut to size from a larger section. Each lead 402 is preferably 70 mils from top to bottom, and spaced apart so that each lead 402 corresponds to and will mate with a conductive pad 214. Leads 402 are held in place by an integral support 404. Support 404 may have holes 406 for stacking and/or retention purposes. Leads 402 are compliant, i.e., a semi-rigid characteristic that allows leads 402 to deform in response to changes in environment (e.g., bending under applied force, thermal expansion under increased temperature, thermal contraction due to decreased temperature) and substantially return to an original state upon removal of the change in the environment.

Array 400 connects to flex board 116 as follows. Array 400 is placed into a fixture using holes 406, and flux and/or solder paste is applied to leads 402 and conductive pads 214 using know methods (e.g., squeegee, stencils). Flex board 116 is then also loaded into an appropriate fixture to hold it in place relative to array 400 with the leads 402 in contact with the conductive pads 214 via the flux/solder paste. Array 400 and flex board 116 are then sent through a reflow oven, which melts the solder in leads 402 and conductive pads 214 to form conductive joints there between. The completed product forms connector 112.

Referring now also to FIG. 1, the completed connector 112 is slid over the pins 108 through holes 210 until connection 112 is at the desired location. The free ends of leads 114 are soldered to the underlying circuit board 100. Connector 112 remains in place via a press fit, or solder 118 can be added above and/or below holes 210.

The flexible insulator 204/208 in connector 112 provides a certain degree of give relative to any minor production misalignment between the pins 108 and holes 210, such that any perfect alignment will not place undue stress on the solder connections. The complaint characteristic of leads 402 also allows it absorb most of the force generated by a changing environment without placing undue stress on the solder joints themselves. The resulting solder joints were observed to remain intact for over three hundred (300) thermal cycles of −40° C. to +100° C. at a rate of one cycle per hour under induced misalignment of 10 mils, which simulates approximately twenty years of military use and ten years of space use.

Figure 6A:
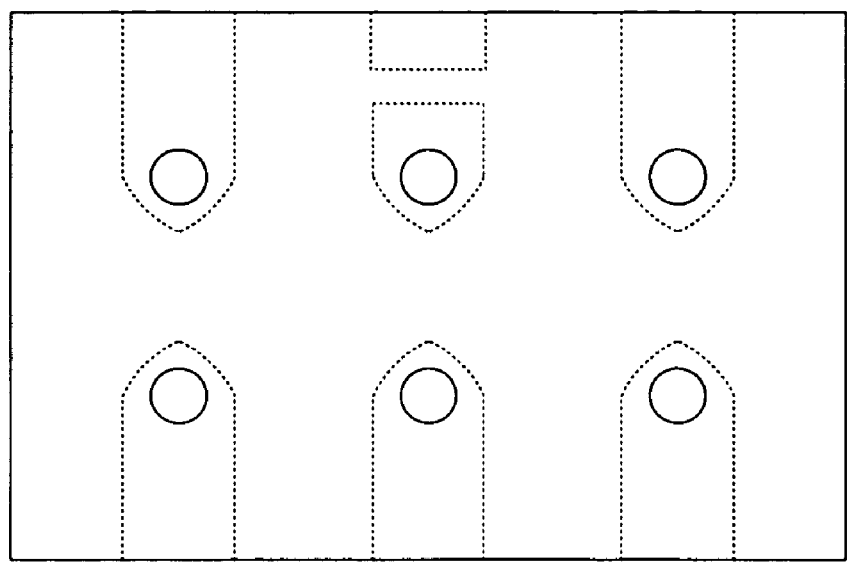
FIGS. 6(a) and (b) are top views of a connector according to another embodiment of the invention.
Figure 6B:
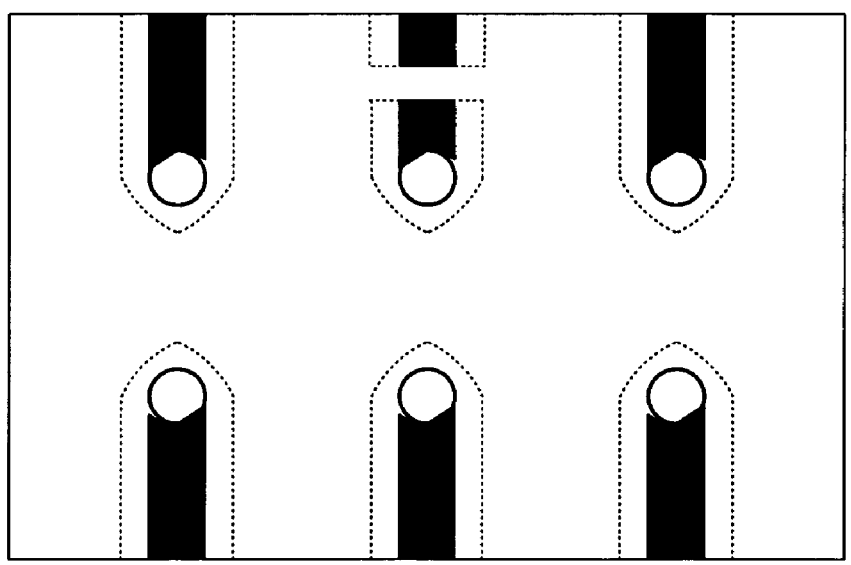

In the above embodiment, each conductive pad has one hole and one complaint lead, each defining an individual conductive path. However, the invention is not so limited, as not every pathway is necessary or desirable, and thus the electrical pathway need not be formed for each individual pad. For example, a different etching mask could be used to remove the connective copper between the hole and pad, such as shown in FIGS. 6(a) and 6(b). Various complaint leads could be removed, either broken off from the array before attachment or after attachment. Solder need not be applied to any particular pad or lead, such that there is an air gap between the pad/lead and/or lead/board. Copper pad 206 need never be formed in the first plane (e.g., the area is etched away) such that hole 108 passes through insulator 204/208 without providing a conductive path for pin 108.

As shown in FIG. 1, leads 114 are preferably S shaped, with the lower portion of the S facing inward to allow easier access to circuit board 100 for soldering. However, the invention is not so limited, as any desirable shape could be used. C and Z shapes are non-limiting examples of acceptable alternatives. U.S. Pat. No. 5,294,039 shows no-limiting examples of such shapes, and is incorporated by reference in its entirety.

Referring now to FIGS. 5(a) and 5(b), another embodiment of a connector of the present invention is shown. The connector includes a flex board 502 substantially identical to 116 discussed above. The exposed contact pads of flex board 502 are soldered to exposed portions of a flex cable 504. The flex cable 504 terminates in individual leads 505 which are electrically connected to circuits on the underlying board 506, either by solder or an appropriate electrical connector.

The embodiments herein show a single connector for a single side of a board. However, the invention is not so limited. Multiple connections can be used, either on either side of the board (or both sides). Connector 112 could also have two sets of leads 114, one facing upwards and one facing downwards to connect with two different circuit boards.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims

What is claimed is:

1. A system for connecting circuit boards, comprising:
   a plurality of overlapping spaced apart circuit boards;
   a plurality of conductive pins passing through holes in said circuit boards; and
   a connector, comprising:
      a flexible sheet insulator;
      a plurality of conductive surfaces separated and supported by said flexible sheet insulator;
      at least one of said conductive surfaces having a hole there through and a bent compliant lead extending there from;
      said hole engaging one of said pins; and
      said bent compliant lead connecting to one of said circuit boards.

2. The system of claim 1, wherein said compliant lead has a substantially S shape.

3. The system of claim 1, wherein said compliant lead has a substantially C shape.

4. The system of claim 1, wherein said compliant lead has a substantially Z shape.

5. The system of claim 1, wherein said flexible sheet insulator is a polyimide film.

6. The system of claim 1, wherein said compliant lead is made of copper covered with solder.

7. The system of claim 1, wherein said hole is bordered by copper covered with solder.

8. The system of claim 1, further comprising solder connecting said hole to said one of said pins.

9. The system of claim 1, further comprising said hole and said one of said pins forming a press fit.

10. The system of claim 1, further comprising:
    said bent compliant lead extending independently from said flexible sheet insulator.

11. The system of claim 1, wherein the plurality of circuit boards are substantially parallel.

12. A connector, comprising:
    a flexible sheet insulator; and
    a plurality of conductive surfaces separated and supported by said flexible sheet insulator, each of said conductive surfaces having a hole there through and a bent compliant lead extending there from.

13. The system of claim 12 wherein said compliant lead has a substantially S shape.

14. The system of claim 12 wherein said compliant lead has a substantially C shape.

15. The system of claim 12 wherein said compliant lead has a substantially Z shape.

16. The system of claim 12 wherein said flexible insulator is a polyimide film.

17. The system of claim 12 wherein said compliant lead is made of copper covered with solder.

18. The system of claim 12 wherein said hole is bordered by copper covered with solder.

19. The system of claim 12, further comprising solder connecting said hole to a pin.

20. The system of claim 19, further comprising said hole and said pin forming a press fit.

21. The system of claim 12, further comprising:
    said bent compliant lead extending independently from said flexible sheet insulator.

22. The system of claim 12, wherein the plurality of circuit boards are substantially parallel.

* * * * *